United States Patent
Kotani et al.

(10) Patent No.: US 6,964,031 B2
(45) Date of Patent: Nov. 8, 2005

(54) MASK PATTERN GENERATING METHOD AND MANUFACTURING METHOD OF SEMICONDUCTOR APPARATUS

(75) Inventors: Toshiya Kotani, Sagamihara (JP); Satoshi Tanaka, Kawasaki (JP); Soichi Inoue, Yokohama (JP); Sachiko Kobayashi, Ichikawa (JP); Hirotaka Ichiakwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 10/255,832

(22) Filed: Sep. 27, 2002

(65) Prior Publication Data

US 2003/0074646 A1    Apr. 17, 2003

(30) Foreign Application Priority Data

Sep. 29, 2001   (JP) ............................. 2001-375025
Sep. 18, 2002   (JP) ............................. 2002-271546

(51) Int. Cl.[7] .......................................... G06F 17/50
(52) U.S. Cl. ........................................ 716/19; 716/4
(58) Field of Search ........ 716/2, 4–5, 19–21; 430/4–5, 430/30

(56) References Cited

U.S. PATENT DOCUMENTS

| | | | | |
|---|---|---|---|---|
| 5,682,323 A | * | 10/1997 | Pasch et al. | 716/19 |
| 5,879,844 A | * | 3/1999 | Yamamoto et al. | 430/30 |
| 5,991,006 A | * | 11/1999 | Tsudaka | 355/53 |
| 6,060,368 A | * | 5/2000 | Hashimoto et al. | 438/401 |
| 6,077,310 A | * | 6/2000 | Yamamoto et al. | 716/19 |
| 6,175,953 B1 | * | 1/2001 | Scepanovic et al. | 716/21 |
| 6,243,855 B1 | * | 6/2001 | Kobayashi et al. | 716/19 |
| 6,269,472 B1 | * | 7/2001 | Garza et al. | 716/21 |
| 6,425,113 B1 | * | 7/2002 | Anderson et al. | 716/5 |
| 6,523,162 B1 | * | 2/2003 | Agrawal et al. | 716/19 |
| 6,584,609 B1 | * | 6/2003 | Pierrat et al. | 716/19 |
| 2001/0005566 A1 | * | 6/2001 | Kotani et al. | 430/5 |

(Continued)

FOREIGN PATENT DOCUMENTS

| | | |
|---|---|---|
| JP | 9-319067 | 12/1997 |
| JP | 2001-188336 | 7/2001 |
| JP | 2001-194770 | 7/2001 |
| WO | WO 01/65315 A2 | 9/2001 |

OTHER PUBLICATIONS

Newmark et al., "Large Area Optical Proximity Correction using Pattern Based Corrections," SPIE (1994), 2322:374-386.

Notification For Filing Opinion issued by the Korean Patent Office in a counterpart foreign application with mailing date of Oct. 15, 2004.

Primary Examiner—Leigh M. Garbowski
(74) Attorney, Agent, or Firm—Finnegan, Henderson, Farabow, Garrett & Dunner, L.L.P.

(57) ABSTRACT

A mask pattern generation method of generating a mask pattern from a designed pattern, comprising preparing the designed pattern, preparing a correction parameter, preparing a first correction library in which a plurality of pairs of an edge coordinate group and a correction value group to correct the edge coordinate group is registered, acquiring edge coordinate groups of the designed patterns, generating a second correction library in which only the plurality of pairs of an edge coordinate group agreeing with the acquired edge coordinate group and the correction value group is registered in the first correction library and simulation using the correction parameter, and correcting the designed pattern using the second correction library.

19 Claims, 9 Drawing Sheets

U.S. PATENT DOCUMENTS

2002/0188925 A1 * 12/2002 Higashi .................... 716/21
2003/0061592 A1 * 3/2003 Agrawal et al. ............ 716/19
2003/0115569 A1 * 6/2003 Ikeuchi .................... 716/19
2003/0126582 A1 * 7/2003 Kobayashi et al. ......... 716/21

* cited by examiner

MASK PATTERN GENERATING METHOD AND MANUFACTURING METHOD OF SEMICONDUCTOR APPARATUS

CROSS-REFERENCE TO RELATED APPLICATIONS

This application is based upon and claims the benefit of priority from the prior Japanese Patent Applications No. 2001-375025, filed Sep. 29, 2001; and No. 2002-271546, filed Sep. 18, 2002, the entire contents of both of which are incorporated herein by reference.

BACKGROUND OF THE INVENTION

1. Field of the Invention

The present invention relates to a method of generating a mask pattern for manufacturing a semiconductor apparatus and a manufacturing method of the semiconductor apparatus.

2. Description of the Related Art

In recent years, a semiconductor manufacturing technique has made very remarkable progress, and semiconductors each having a minimum processed dimension of 0.18 $\mu$m have been mass-produced. Such miniaturization is realized by rapid progress of fine pattern forming techniques such as a mask process technique, optical lithography technique, and etching technique. With a sufficiently large pattern size, the technique includes: drawing a plane shape of an LSI pattern to be formed on a wafer as a designed pattern; generating a mask pattern faithful to the designed pattern; transferring the mask pattern onto the wafer by a projection optical system; and etching a foundation, so that the pattern can be formed on the wafer as designed. However, with progress of the miniaturization of the pattern, it has been difficult to form the pattern faithfully in each process, and a problem has occurred that a final finished dimension is not faithful to the designed pattern.

Particularly in lithography and etching processes most important for achieving a fine processing, other pattern layout environments around the pattern to be formed largely influence the dimension precision of the pattern. To reduce these influences, techniques (hereinafter referred to as PPC techniques) such as an optical proximity correction (OPC) technique for adding an auxiliary pattern beforehand to the designed pattern so that the processed dimension is formed in a desired pattern, and a process proximity correction (PPC) technique are reported in Jpn. Pat. Appln. KOKAI Publication No. 1997-319067 and SPIE Vol. 2322 (1994) 374 (Large Area Optical Proximity Correction using Pattern Based Correction, D. M. Newmark et. al).

The PPC technique is largely classified into two techniques: including a rule based PPC technique of ruling a correction value in accordance with a certain standard and correcting the pattern based on the rule; and a model based PPC technique of using a simulator which can estimate a finished shape on the wafer passed through mask, lithography and etching processes to calculate the correction value. In the rule based PPC technique, a high-speed correction is possible, but it is difficult to perform a high-precision correction. In the model based PPC technique, although the high-precision correction is possible, complicated calculations such as optical simulation are required, much time is therefore required to calculate the correction value, and a turnaround time (TAT) of mask generation is lengthened.

To shorten the time for correction value calculation, the above-described known examples have proposed the following method so that the correction value calculation time is reduced. One example of the method is shown in FIG. 11.

Step S501

A reference point is set in a designed layout, and an area centering on the reference point and having a certain size is cut out. In the Jpn. Pat. Appln. KOKAI Publication No. 1997-319067, it is described that the reference point is determined "in accordance with a surrounding layout". It is described in SPIE that the reference point is determined "in accordance with a corner or line segment".

Step S502

A database (hereinafter referred to as a correction value library) in which an edge coordinate group (hereinafter referred to as a correction environment) included in the area and the correction value for the correction environment are stored is checked. This correction value library is searched for the correction environment which agrees with the correction environment cut out in the step S501.

Step S503

If there is the agreeing correction environment, the corresponding stored correction value is referred to and the correction is performed.

Step S504

If there is no agreeing correction environment, the correction value is calculated by the optical simulation, process simulation, and equations such as a polynomial equation representing the correction value. Subsequently, the corresponding correction environment and correction value are added to the correction value library.

All the reference points are subjected to the process of the steps S501 to S504, and the generation of a mask pattern ends.

In this correction method, the correction environment which has appeared once and the corresponding correction value are stored in the correction value library. Therefore, even when the same environment appears again, it is unnecessary to calculate the correction value. As a result, as many simulations requiring much time as possible can be reduced, and it is therefore possible to reduce the generation time of the mask pattern.

In actual device development, small-scaled design data is first generated for purposes of device characteristics measurement and process flow construction, and the mask is generated based on the data. Thereafter, a product for mass production is developed, and further a product derived from the product (hereinafter referred to as a derivative product) is sometimes generated. These small-scaled data and types of the pattern layout for use in the product for mass production or the derivative product are not necessarily different, and there are a large number of redundant pattern types. Moreover, during the device development, a mask is frequently revised with condition changes of fine processing processes such as mask, lithography, and etching.

Under these circumstances, when a conventional mask pattern process is performed, problems delaying TAT of mask generation are considered as follows. First, the correction value library of a generation start time of the mask pattern does not include the edge coordinate group and the corresponding correction value. Therefore, a percentage with which the correction value is obtained by the simulation of the inputted edge coordinate group is very high. Therefore, with a larger scale of the design data, the number of simulated correction environments increases, and this is a cause for deterioration of TAT of mask generation.

Moreover, in the conventional method, it is necessary to newly generate the correction value library again even during the revision of the mask. A method of efficiently using the correction value library in consideration of the above-described circumstances has not been proposed.

As described above, at the start of the generation of the mask pattern, the edge coordinate group and the corresponding correction value are not inputted in the correction value library, a percentage with which the correction value is calculated by the simulation is high, and there is a problem that the TAT of the mask pattern generation is deteriorated.

Moreover, in the conventional method, it is necessary to newly generate the correction value library again even during the revision of the mask, and a method of efficiently using the correction value library in consideration of the circumstances has not been proposed.

BRIEF SUMMARY OF THE INVENTION (1) According to one aspect of the invention, there is provided a mask pattern generation method of generating mask patterns from designed patterns, comprising: preparing a correction library in which a plurality of pairs of an edge coordinate group of some of the designed patterns and a correction value group to correct the edge coordinate group is registered, before the designing of the designed patterns has ended; acquiring first edge coordinate groups of the designed patterns being designed; checking whether or not a correction value group corresponding an edge coordinate group agreeing with the first edge coordinate group is registered in the correction library; calculating the correction value group to correct the first edge coordinate group by simulation based on a predetermined correction parameter, when the correction information is not registered; registering the pair of the calculated edge coordinate group and first correction value group into the correction library; reading the corresponding correction value group from the correction library, when the correction information is registered; and correcting the designed pattern in accordance with the calculated correction value group or the read correction value group.

(2) According to another aspect of the invention, there is provided a mask pattern generation method of generating mask patterns from designed patterns, comprising: preparing a correction library in which a plurality of pairs of an edge coordinate group and a correction value group to correct the edge coordinate group are registered; acquiring first edge coordinate groups from the first designed patterns; checking whether or not an edge coordinate group agreeing with the first edge coordinate group is registered in the correction library; calculating the correction value group to correct the first edge coordinate group by simulation based on a first correction parameter, when the edge coordinate group is not registered; registering a pair of the calculated correction value group and the first edge coordinate group into the correction library; reading the corresponding correction value group from the correction library, when the edge coordinate group is registered; correcting the first designed pattern in accordance with the calculated correction value group or the read correction value group, to generate the first mask pattern; acquiring second edge coordinate groups of a second designed pattern different from the first designed pattern; checking whether or not the edge coordinate group agreeing with the second edge coordinate group is registered in the correction library; calculating the correction value group with respect to the second edge coordinate group by the simulation based on a second correction parameter, when the edge coordinate group is not registered; registering a pair of the calculated correction value group and second edge coordinate group into the correction library; reading the corresponding correction value group from the correction library, when the edge coordinate group is registered; and correcting the second designed pattern in accordance with the calculated correction value group or the read correction value group, to generating a second mask pattern.

(3) According to another aspect of the invention, there is provided a mask pattern generation method of generating a mask pattern from a designed pattern, comprising: preparing the designed pattern; preparing a correction parameter; preparing a first correction library in which a plurality of pairs of an edge coordinate group and a correction value group to correct the edge coordinate group is registered; acquiring edge coordinate groups of the designed patterns; generating a second correction library in which only the plurality of pairs of an edge coordinate group agreeing with the acquired edge coordinate group and the correction value group is registered in the first correction library and simulation using the correction parameter; and correcting the designed pattern using the second correction library.

DETAILED DESCRIPTION OF THE INVENTION

Embodiments of the present invention will be described hereinafter with reference to the drawings.

(First Embodiment)

Figure 1:
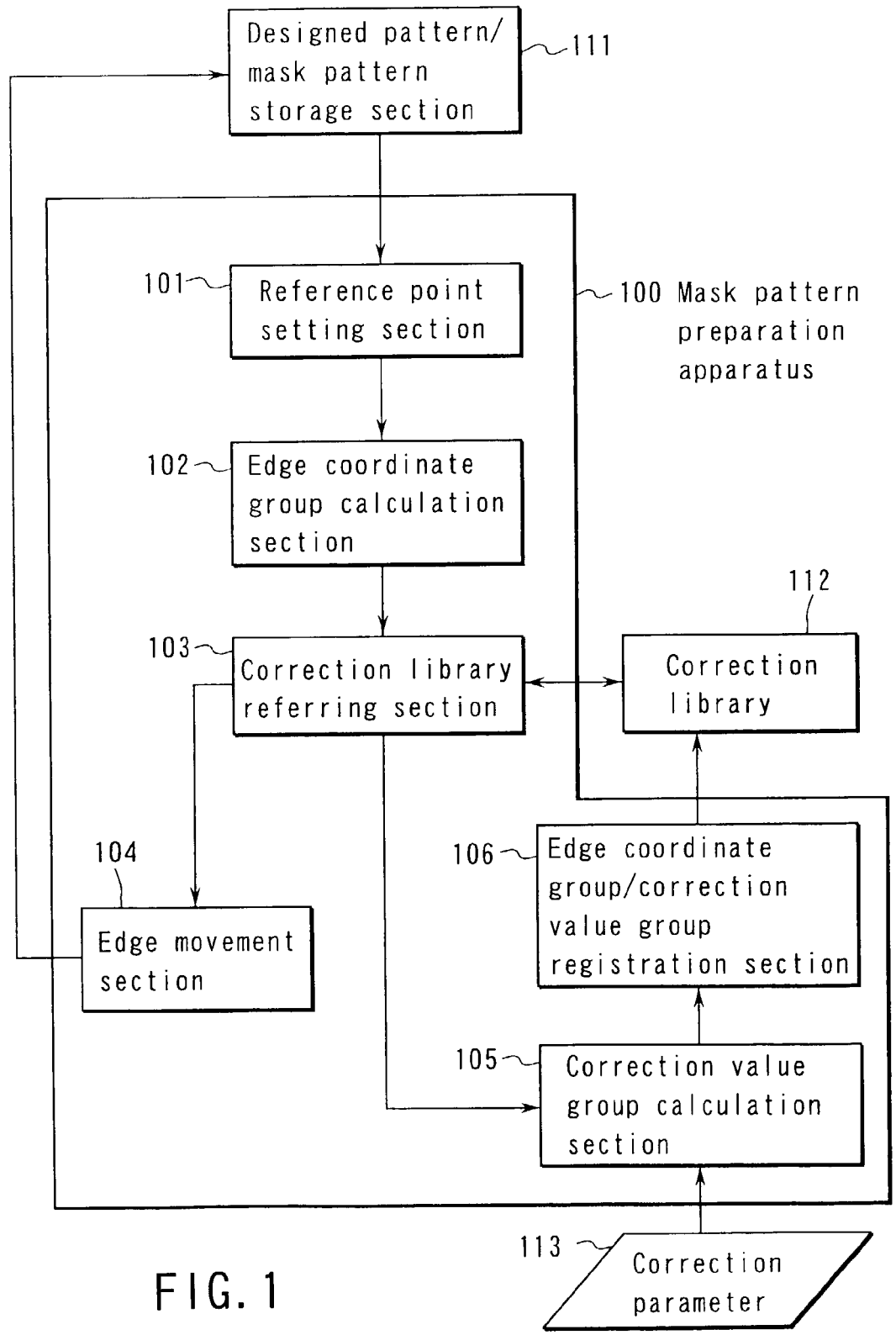
FIG. 1 is a block diagram showing a schematic constitution of a mask pattern generation apparatus according to a first embodiment.

A first embodiment of the present invention will be described. First, a mask pattern correction process method with a flow of conventional device development is shown in FIG. 1. In general, the development of devices such as a memory and logic is performed in accordance with the flow shown by arrows of FIG. 1. First, a small-scaled test sample is formed for a main purpose of constructing a process flow or measuring basic characteristics of the device. After basic evaluation of the test sample ends, a product device starts to be formed.

Figure 2:
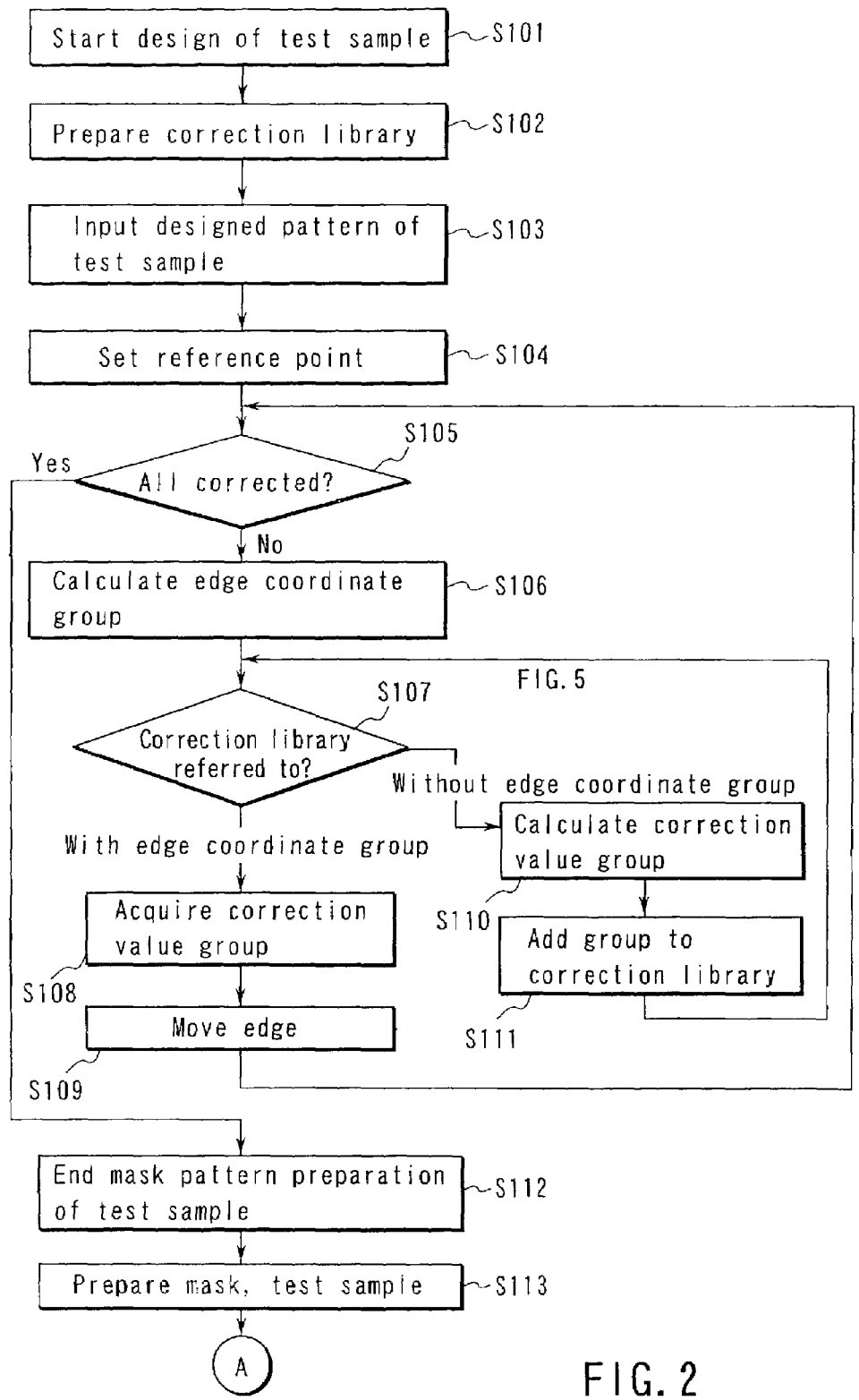
FIG. 2 is a flowchart showing a generation method of the mask pattern according to the first embodiment.
Figure 3:
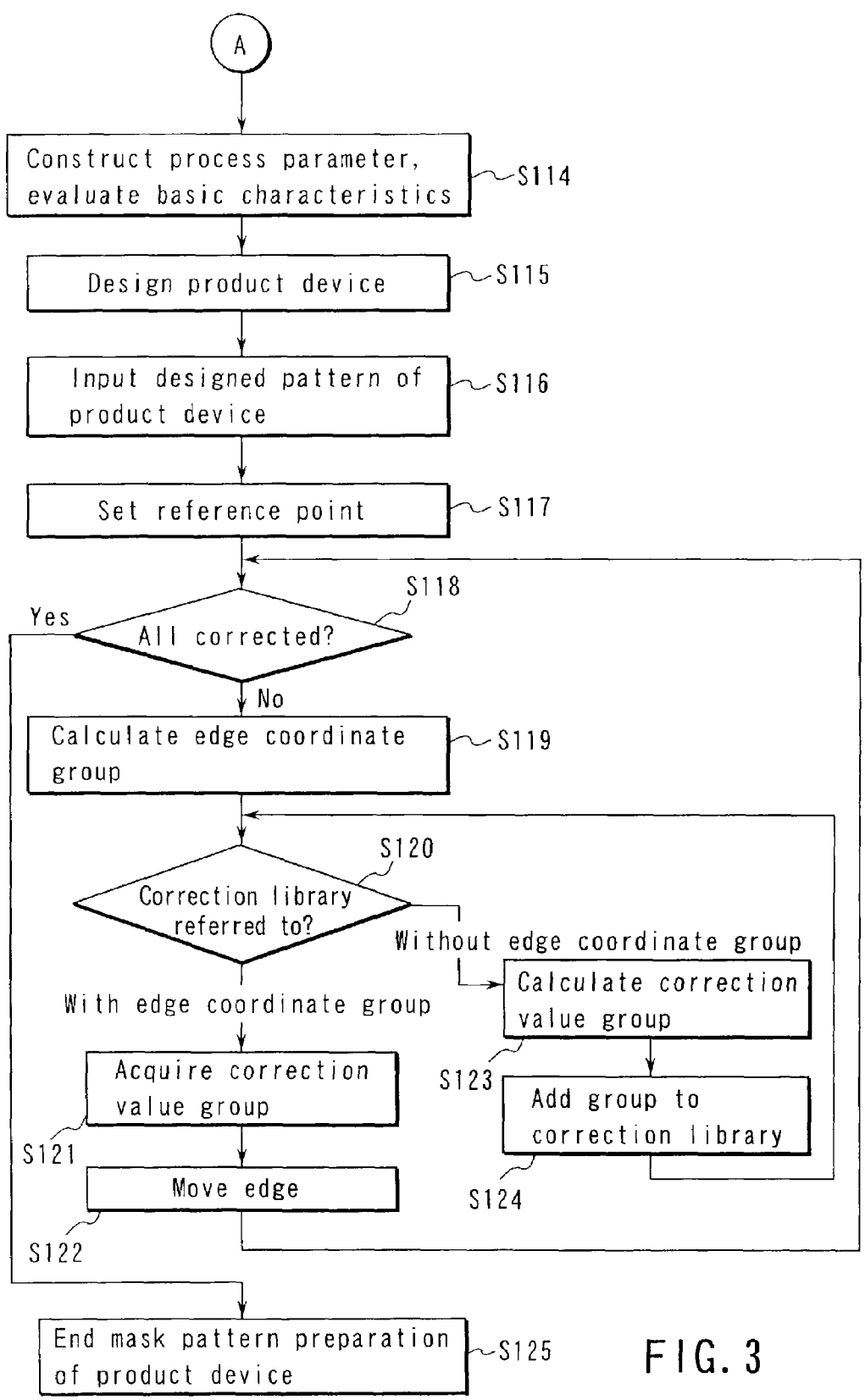
FIG. 3 is a flowchart showing a generation method of the mask pattern according to the first embodiment.
Figure 4:
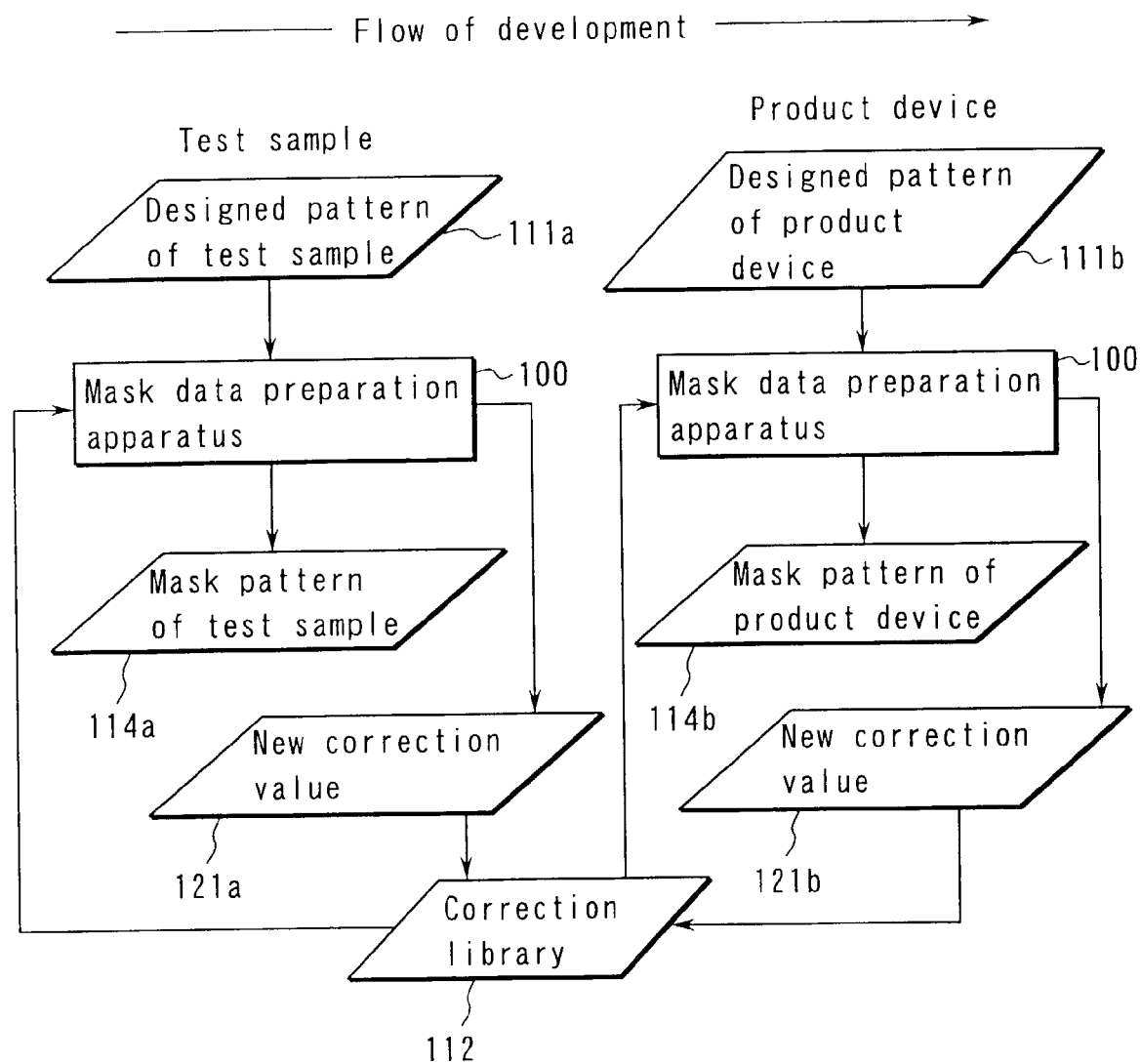
FIG. 4 is a diagram showing an idea of a generation method of the mask pattern according to the first embodiment.

Moreover, FIG. 1 is a block diagram showing a schematic constitution of a mask data generation apparatus according to the first embodiment of the present invention. FIGS. 2 and 3 are flowcharts showing the generation method of the mask pattern according to the first embodiment. FIG. 4 is a diagram showing an idea of a mask pattern generation method according to the first embodiment of the present invention.

Furthermore, FIG. 1 is a diagram showing a mask pattern correction process method according to the first embodiment of the present invention.

(Step S101)

First, the test sample starts to be designed.

(Step S102)

A correction library 112 is generated before the design of the test sample ends. In the correction library 112, correction value library files classified by a device type, layer type, and process parameter are managed. When the mask pattern of the test sample is generated, there is no data in the correction library 112. However, correction information including an edge coordinate group and a correction value group corresponding to the edge coordinate group is preferably inputted into the correction library 112, before the design of the test sample ends. The following three are examples of a method of preparing the correction value group corresponding to the edge coordinate group.

A first generation method includes: obtaining a pattern group for use in the test sample during or before the designing; and calculating the correction value group corresponding to an edge coordinate of a pattern group.

A second generation method includes: obtaining information of a module of standard cells for use in designing a wiring pattern beforehand from a designer; and subjecting the pattern of the obtained module to simulation beforehand to obtain the correction value group with respect to the edge coordinate group of the pattern of each module.

A third generation method includes: performing data processing and lithography simulation with a small-scaled pattern by the designer during the designing of a layout in order to estimate a finished shape on a wafer in some case. In this case, the library files generated during the data processing are recovered from the designer.

A fourth generation method includes: shrinking a design resource (design layout) used in the previous preparation so as to satisfy a design rule (D.R.) of the present preparation; generating the design layout expected to be used in the present preparation; and generating a library file for use in processing the data based on the design layout.

In the first generation method, if a designer's consent is obtained beforehand, it is relatively easy to obtain the data during the designing/before the designing ends. The second generation method is an effective method in a logic device designed for each module.

Moreover, if a degree of difficulty of the lithography process further increases from this time, the designer needs to judge a possibility of forming the pattern on the wafer based on a simulation result during the designing. When such design mode is assumed, the data processing and lithography simulation are frequently repeated with the small-scaled data. Therefore, the library files generated in this case are recovered, and thereby a pattern group included in the test sample can be known beforehand.

Furthermore, in the fourth generation method, since the D.R. in the present generation and the design layout used in the previous generation are inputted into a tool called a compaction tool, it is possible to include the design layout of the previous generation in the design layout satisfying the D.R. of the present generation in a compact form. With the use of this tool, the design layout estimated to be used in the present generation can be generated to some degree, before the designer designs the layout. It is also possible to estimate the pattern group supposed to be used in the present generation from the design layout estimated in this manner.

(Step S103)

After the layout of the test sample, data of a designed pattern (first designed pattern) 111a of the test sample is stored in a designed pattern/mask pattern storage section 111.

(Step S104)

A reference point setting section 101 of a mask pattern generation apparatus 100 sets a reference point in a predetermined position of the designed pattern 111a of the test sample. An area centering on each reference point and having a certain size is cut out. Here, the cut area is in a range in which a proximity effect is extended from a correction object point. The reference point is set to a corner or side in accordance with a surrounding layout.

(Step S105)

It is checked whether or not all the reference points set in the step S104 are corrected. When all the reference points are not corrected, the flow shifts to step S106. When all the reference points are corrected, the flow shifts to step S112.

(Step S106)

An edge coordinate group calculation section 102 of the mask pattern generation apparatus 100 obtains the coordinate position of the edge of the pattern included in the cut area. An assembly of obtained coordinate positions will hereinafter be referred to as the edge coordinate group.

(Step S107)

Subsequently, a correction library referring section 103 of the mask pattern generation apparatus 100 refers to the correction library 112 in which the correction information including the edge coordinate group and correction value group is stored, and searches the correction library 112 for the edge coordinate group which agrees with the edge coordinate group obtained in the step S106.

(Step S108)

When there is the edge coordinate group in the correction library 112, the correction library referring section 103 acquires the correction value group corresponding to the edge coordinate group from the correction library 112.

(Step S109)

The correction library referring section 103 transfers the edge coordinate group and the acquired correction value group to an edge movement section 104 of the mask pattern generation apparatus 100. Subsequently, the edge movement section moves the edge of the side including the edge coordinate group in the designed pattern 111a of the test sample stored in the designed pattern/mask pattern storage section 111 based on the transferred correction value group.

(Step S110)

When there is not the edge coordinate group in the correction library 112, a correction value group calculation section 105 of the mask pattern generation apparatus 100 calculates the correction value group corresponding to the edge coordinate group by an optical simulation, or an OPC using an equation such as a polynomial equation representing the correction value, and a process simulation, or a PPC using the equation such as the polynomial equation representing the correction value. A correction parameter 113 is constituted of an optical parameter, and process parameter. It is to be noted that with a process proximity effect not raising any problem, it is unnecessary to perform a process proximity correction and only the optical proximity correction may be performed.

(Step S111)

An edge coordinate group/correction value group registration section 106 of the mask pattern generation apparatus 100 additionally stores the correction value group newly obtained in the step S110 and the corresponding edge coordinate group in the correction library 112. Thereafter, steps S107 to S109 are successively executed.

(Step S112)

When the above-described processes are applied to the respective reference points and all the reference points are subjected to the optical proximity correction and process proximity correction, the generation of the mask pattern (first mask pattern) of the test sample ends.

(Steps S113, S114, S115)

The generated mask pattern is used to form a mask, and the formed mask is used to form the test sample (S113). This test sample is used to construct a process flow or evaluate basic characteristics of a device (S114). Subsequently, a product device is designed (S115).

(Step S116)

After the designing of the product device ends, a designed pattern (second designed pattern) 111b of the product device is stored in the designed pattern/mask pattern storage section 111.

(Step S117)

The reference point setting section 101 sets a plurality of reference points in arbitrary positions on the designed pattern 111b of the product device from the designed pattern 111a of the product device stored in the designed pattern/mask pattern storage section 111. An area centering on each reference point and having a certain size is cut out. Here, the cut area is in a range in which the proximity effect is extended from the correction object point. The reference point is set to the corner or side in accordance with the surrounding layout.

(Step S118)

It is checked whether or not all the reference points set in the step S115 are corrected. When all the reference points are not corrected, this step shifts to step S119. When all the reference points are corrected, the step shifts to step S125.

(Step S119)

The edge coordinate group calculation section 102 obtains the coordinate position of the edge of the pattern included in the cut-out area centering on each reference point.

(Step S120)

Subsequently, the correction library referring section 103 refers to the correction library 112 in which the correction value group corresponding to the edge coordinate group is stored, and searches the correction library 112 for the edge coordinate group which agrees with the edge coordinate group obtained in the step S119.

(Step S121)

When there is the edge coordinate group in the correction library 112, the correction library referring section 103 acquires the correction value group corresponding to the edge coordinate group from the correction library 112.

(Step S122)

The correction library referring section 103 transfers the edge coordinate group and acquired correction value group to the edge movement section 104. Subsequently, the edge movement section 104 moves the edge of the side including the edge coordinate group of the designed pattern 111b of the product device stored in the designed pattern/mask pattern storage section 111 based on the transferred correction value group.

(Step S123)

When there is no edge coordinate group in the correction library 112, the correction value group calculation section 105 calculates the correction value group corresponding to the edge coordinate group by the optical simulation, or the OPC using the equation such as the polynomial equation representing the correction value, and the process simulation, or the PPC using the equation such as the polynomial equation representing the correction value.

(Step S124)

The edge coordinate group/correction value group registration section 106 additionally stores the correction value group newly obtained in the step S123 and the corresponding edge coordinate group in the correction library 112. Thereafter, the steps S120 to S122 are successively executed.

(Step S125)

When the above-described processes are applied to the respective reference points, and all the reference points are subjected to the optical proximity correction and process proximity correction, the generation of the mask pattern of the product device ends.

Thereafter, the mask is actually manufactured based on the generated mask pattern. Thereafter, the manufactured mask is used to expose a resist film (film to be processed) formed on a semiconductor substrate being manufactured in the semiconductor apparatus, and a known method is used to manufacture the semiconductor apparatus.

Since a part of the edge coordinate group included in the test sample and the corresponding correction value group are stored beforehand in the correction library 112 in the above-described mask pattern generation method, it is possible to reduce the number of simulations for the calculation of the correction value.

Subsequently, when the mask data of the product device is generated, the correction library 112 is referred to and the correction is performed. Furthermore, after the generation of the mask data of the test sample, all the correction value groups are stored with respect to the coordinate group of the test sample in the correction library 112. Therefore, as compared with a conventional method in which the values are newly corrected, the number of calculations of the correction value group by the simulation is reduced.

Furthermore, after the generation of the mask for the product device, the mask is revised, or a derivative product device is manufactured. In this case, after the generation of the mask data of the product device, the correction library 112 is used to generate the mask data, so that a generation time of the mask data can be reduced.

When the correction is performed in this manner, the information on the correction pattern and the correction are gradually stored in the correction library file. Therefore, during the generation of new mask data, the number of correction value group calculations by the simulation drastically decreases. This can largely reduce the time required for generating the mask.

(Second Embodiment)

As described in the first embodiment, the correction library file is managed with the library database, and the library file is acquired every correction in order to correct the mask pattern. In this case, it is found that the correction value group calculation time by the simulation can be reduced and the mask pattern correction process time can be reduced. However, in actual, the correction value group stored in the correction library 112 needs to be changed with the change of the process. The correction parameter used in correcting the test sample is hardly similar even with respect to the product, and it is necessary to calculate the correction value group using the correction parameter for the product, which is different from the correction parameter for the test sample.

Figure 5:
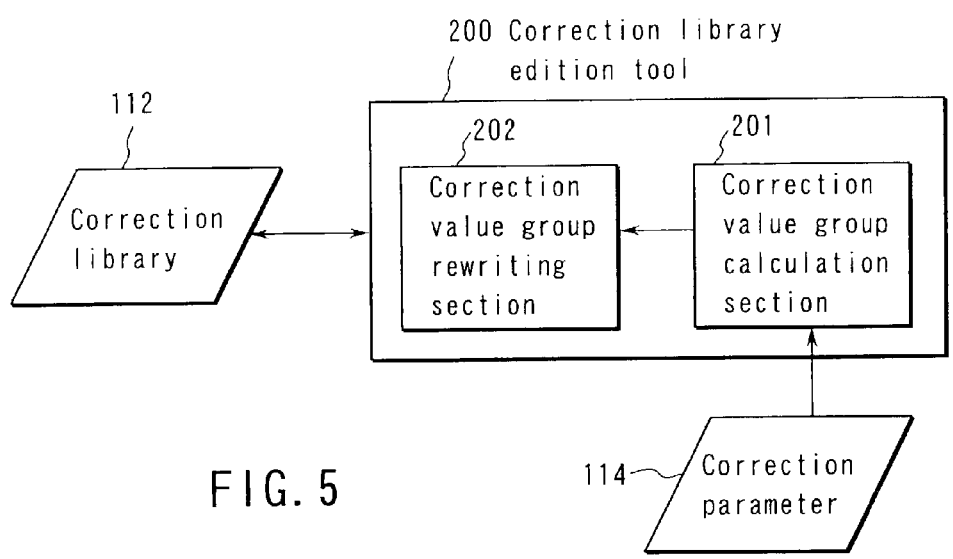
FIG. 5 is a block diagram showing a schematic constitution of a correction value library editing tool according to a second embodiment.

To solve the problem, we have developed an editing tool of the correction library 112. FIG. 5 shows an outline of the correction library editing tool. FIG. 5 is a block diagram showing a schematic constitution of the correction library editing tool according to a second embodiment.

A correction library editing tool 200 is constituted of a correction value group calculation section 201 which has the same function as that of the correction value group calculation section 105 of the mask pattern generation apparatus 100, and a correction value group rewriting section 202. When a correction parameter 114 is inputted into the correction library editing tool 200, the correction value group calculation section 201 successively reads out the edge coordinate group from the correction library 112, and calculates the correction value group for each read edge coordinate group. The correction value group stored in the correction library 112 is rewritten into a newly calculated correction value group by the correction value group rewriting section 202.

With the use of the correction library editing tool 200, it is possible to calculate the correction value group applied to a new process beforehand for each edge coordinate group of the correction pattern included in the test sample and product device.

With the use of the correction library editing tool 200, only the library file can be edited in the latest correction value group in an offline manner, before a mask pattern correction process is started. Therefore, it is unnecessary to perform the time consuming simulation during the mask pattern correction process, so that the mask pattern correction process time can be reduced and TAT of the mask generation can be enhanced. Moreover, when editing operations with the correction library editing tool 200 are performed in parallel by a plurality of CPUs and computers, the correction library can be edited at a higher speed.

It is also possible to rewrite the correction library in this manner in accordance with changes of the process and correction parameter. Even when the process changes, it is possible to process data in a very short time.

It is to be noted that it is unnecessary to rewrite the correction value group of the correction library 112 and that a newly calculated correction value group may be added to the edge coordinate group.

(Third Embodiment)

A metal layer of a DRAM layer was corrected according to the first embodiment. The correction includes: first correcting the test sample; and holding the corrected and generated library file beforehand. Subsequently, the data was corrected using or without using the library file in which product data was generated from the test sample, and each data process time was calculated. As a result, it has been found that the correction time with the library file can be reduced to about 1/10 of the correction time without the library file.

Furthermore, even a derivative product of this generation was corrected in a similar method. It has heretofore been necessary to generate the library from 0. In this case, a very long data process time is required. For the derivative product, the library file for a mother product already exists, and a large number of common pattern groups are used. Therefore, it has been found that the data can be corrected at a very high speed and the correction is very effective even for the derivative product.

(Fourth Embodiment)

Figure 6:
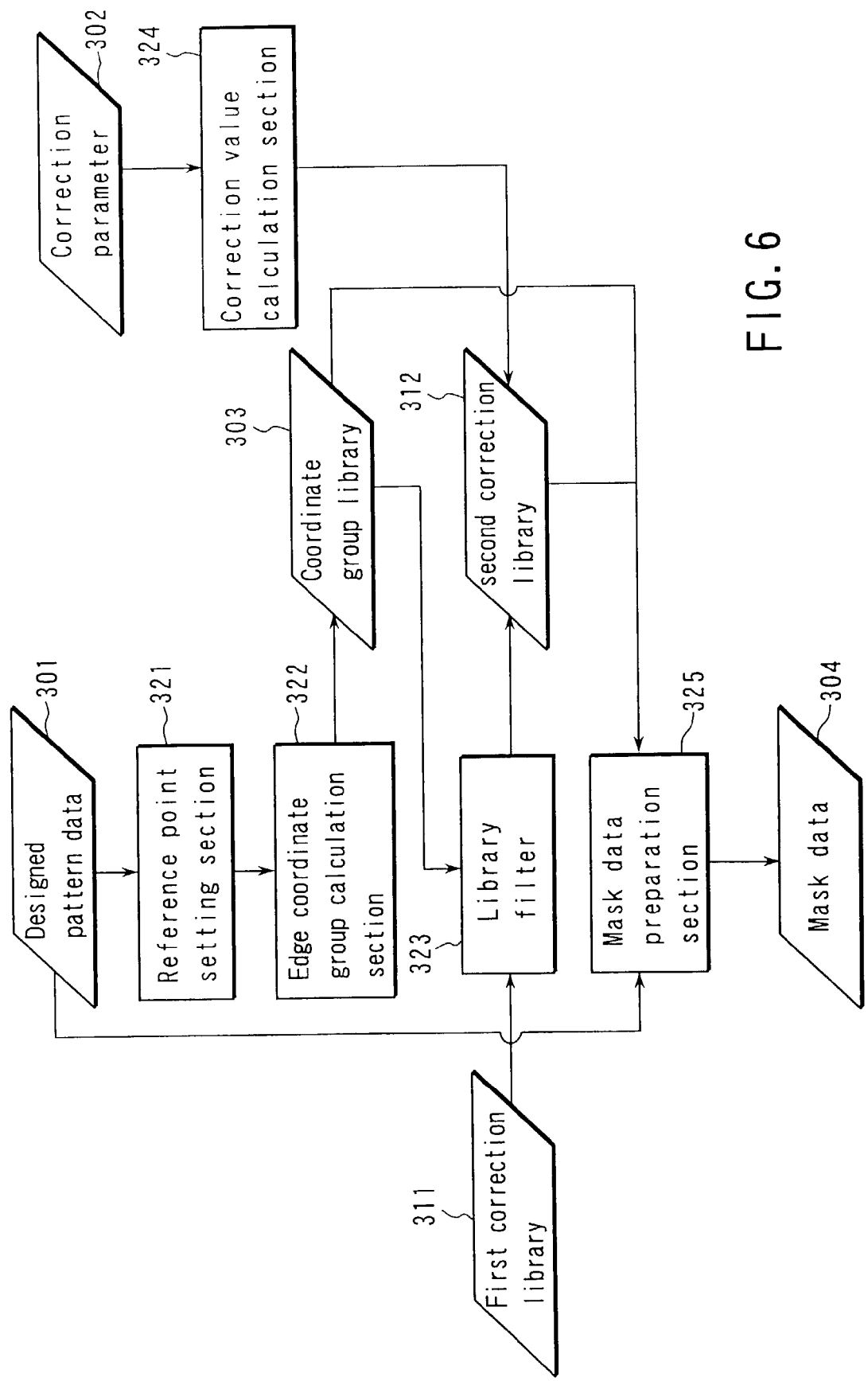
FIG. 6 is a block diagram showing a schematic constitution of a mask data generation apparatus according to a fourth embodiment.
Figure 7:
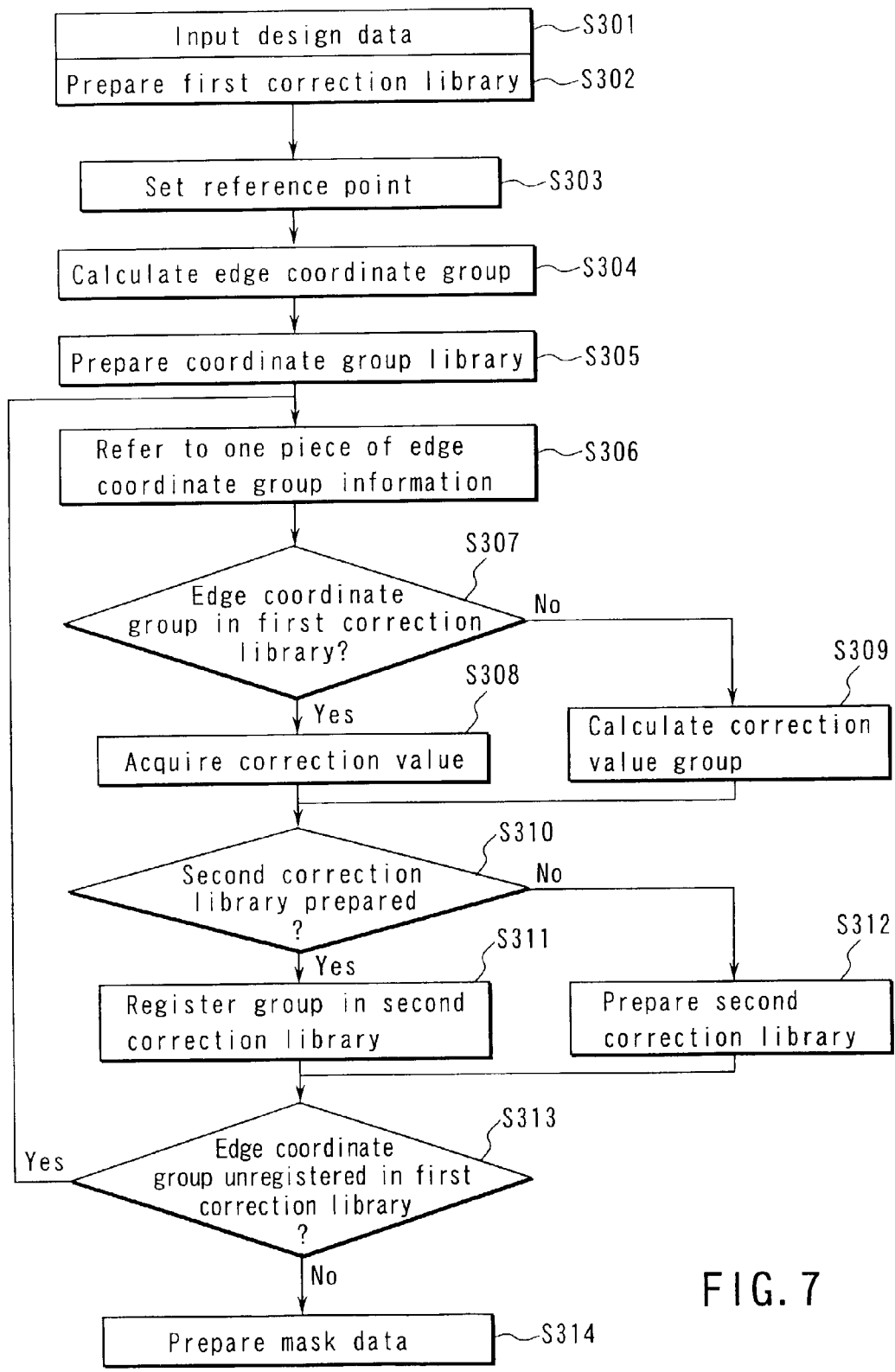
FIG. 7 is a flowchart showing a generation method of the mask data according to the fourth embodiment.

FIG. 6 is a block diagram showing a schematic constitution of a mask data generation apparatus according to a fourth embodiment of the present invention. FIG. 7 is a flowchart showing a generation method of the mask data according to the fourth embodiment of the present invention.

The generation method of the mask data and the constitution of the mask data generation apparatus will be described hereinafter.

(Step S301)

After the end of the layout of the test samples, design data 301 of the pattern is inputted. Moreover, correction parameters 302 such as mask, lithography, development, and etching conditions are also inputted.

(Step S302)

A first correction library 311 is prepared. The first correction library 311 stores one or more sets of correction information including the edge coordinate group and the correction value group corresponding to the edge coordinate group. In the first correction library 311, the respective correction library files classified by the type of the device, layer type, correction parameter, mask process, lithography process, etching process, and optical proximity correction are managed.

(Step S303)

A reference point setting section 321 sets the reference point to the predetermined position of the according to obtained from the design data 301. The area centering on each reference point and having a certain size is cut out. Here, the cut area is in a range in which the proximity effect is extended from the reference point. The reference point is set to the corner or side in accordance with the surrounding layout.

(Step S304)

An edge coordinate group calculation section 322 obtains the coordinate position of the edge of the pattern included in the cut-out area. The assembly of obtained coordinate positions will hereinafter be referred to as the edge coordinate group.

(Step S305)

A coordinate group library 303 is generated in which the edge coordinate group obtained in the step S304 is registered. The edge coordinate group registered in the coordinate group library 303 is only the edge coordinate group obtained in the step S304.

(Step S306)

One edge coordinate group is read from the coordinate group library 303.

(Step S307)

Subsequently, a library filter 323 refers to the first correction library 311 in which the correction value group corresponding the edge coordinate group is also stored, and searches the first correction library 311 for the edge coordinate group which agrees with the edge coordinate group read out in the step S306. With the agreeing edge coordinate group, the step shifts to step S308. Without any agreeing edge coordinate group, the step shifts to step S309. When a library filter 323 refers to the correction the correction library file, a library filter 323 refers a correction library file corresponding to the design rule and layer of said design data.

(Step S308)

As a result of the search of the step S107, when there is the edge coordinate group in the first correction library 311, the library filter 323 acquires the correction value group corresponding to the edge coordinate group from the first correction library 311. After acquiring the correction value group, step S310 is executed.

(Step S309)

As a result of the search of the step S307, when there is not the edge coordinate group in the first correction library 311, a correction value group calculation section 324 calculates the correction value group corresponding to the edge coordinate group by the optical simulation, or the OPC using the equation such as the polynomial equation representing the correction value, and the process simulation, or the PPC using the equation such as the polynomial equation representing the correction value. It is to be noted that with the process proximity effect not raising any problem, it is unnecessary to perform the process proximity correction and only the optical proximity correction may be performed. After calculating the correction value group, the step shifts to step S310.

(Step S310)

It is checked whether or not a second correction library with the set of the edge coordinate group and correction value group registered therein is generated. When the second correction library is not generated, the step shifts to step S312. When the second correction library is generated, the step shifts to step S311.

(Step S311)

As a result of the check, when the second correction library is generated, in step S308 or S309, a combination of the acquired or calculated correction value group with the edge coordinate group is additionally registered into a second correction library 312. After the registration, the step shifts to step S313.

Step S312

As the result of the check, when the second correction library is not generated, the second correction library 312 is generated. Subsequently, the combination of the acquired or calculated correction value group with the edge coordinate group is registered/generated into the second correction library 312. After the generation of the second correction library 312, the step shifts to step S313.

Step S313

The second correction library 312 is compared with the coordinate group library 303, and it is checked whether or not there is an edge coordinate group unregistered in the second correction library 312. When there is the edge coordinate group unregistered in the second correction library 312, the step returns to the step S306. When there is not any edge coordinate group unregistered in the second correction library 312, the step shifts to step S314.

(Step S314)

A mask data generation section 325 corrects the design data 301, and generates mask data 304 based on the correction value group registered in the second correction library 312. The generated mask data 304 is transferred to a requester of the process.

Figure 8:
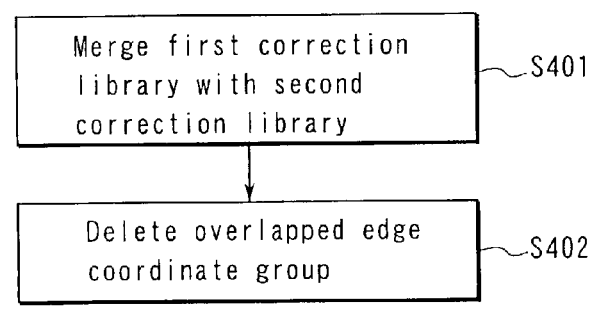
FIG. 8 is a flowchart showing a process after the mask data generation according to the fourth embodiment.

A process to be executed after the mask data generation will next be described with reference to FIG. 8.

(Step S401)

First, the registered data of the first correction library 311 is merged with the registered data of the second correction library 112.

(Step S402)

One of overlapped edge coordinate groups is deleted from the merged library, and a third correction library is generated.

Additionally, this process may also be executed by successively adding/registering the correction information including the correction value group newly calculated in the step S309 and the edge coordinate group into the first correction library.

If parameters (mask, lithography, etching, and the like) concerning the mask correction are changed, the correction value group to be stored in the correction library is calculated again, and used for the next process.

Figure 9:
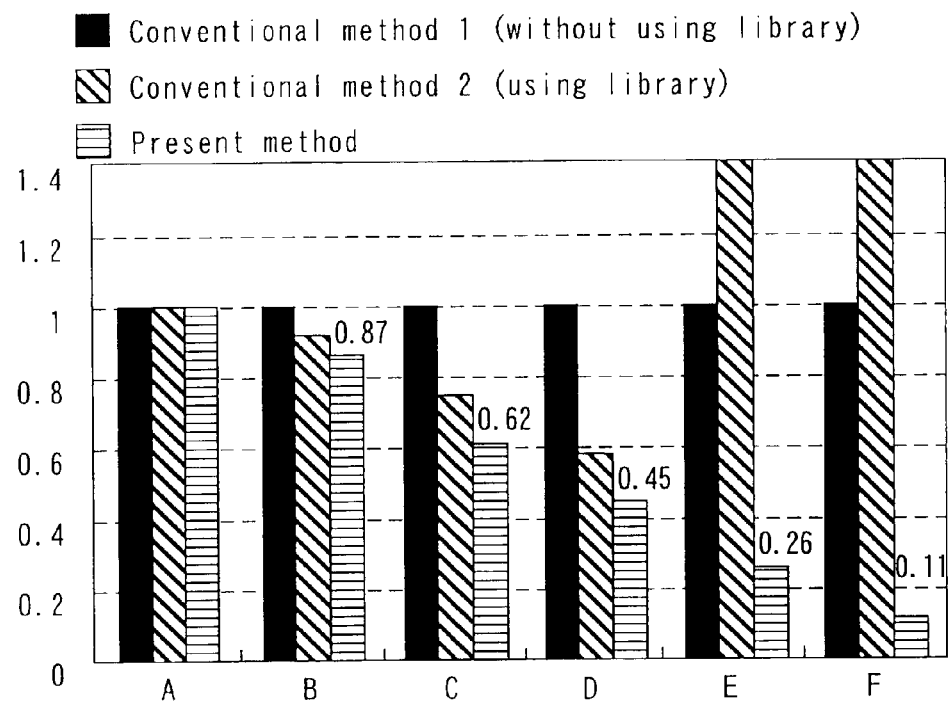
FIG. 9 is a diagram showing a correction time of design data.
Figure 11:
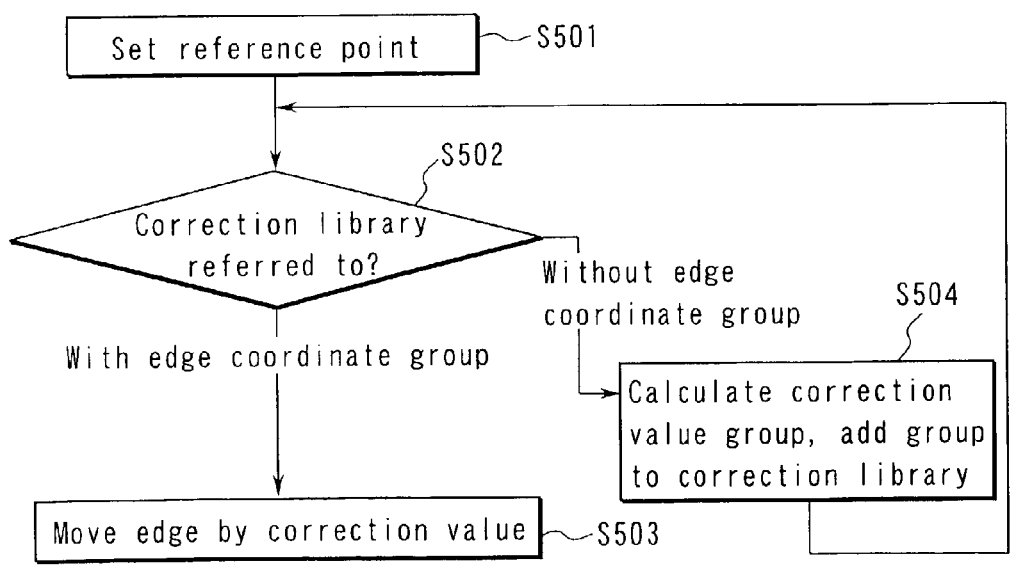
FIG. 11 is a flowchart showing a generation method of a conventional mask pattern.

FIG. 9 shows correction time in correcting contact hole layers of six ASIC devices (A to F) without using the library (conventional method 1), in a conventional correction method using the library (conventional method 2), and in a method described in the present embodiment using the library. The correction time is standardized with the correction time of the conventional method 1 using no library. Products A to F are corrected in an alphabetical order. In the conventional method, the library is used as such for the correction time. The present method comprises: removing environment useless for the next product from the generated library to generate a new library; and using the new library for the correction time.

As shown in FIG. 9, the correction time of the conventional method 2 is shorter than the correction time of the conventional method 1 for the products B to D. However, for the products E, F, the correction time of the conventional method 2 is longer than the correction time of the conventional method 1. This is because the environment unused in correcting the products E, F exists in the library and a time for extracting only the environment effective for the products E, F from the library increases. The correction time of the present method is shorter than the correction time of the conventional method 1 or 2. It has been found that the correction time of the present method can be about 10% of the correction time of the conventional method and the present method is very effective for the mask generation.

In general, an OPC tool includes a hierarchy process tool for converting a hierarchy structure of the design data. The design data of the pattern is first inputted into the hierarchy process tool, subjected to a predetermined hierarchy process, and thereafter inputted into the OPC tool. Examples of the hierarchy process includes a process of converting a data structure to a flat data structure from which the hierarchy structure of the design data.

In the hierarchy process tool, after executing the hierarchy process, the design data is divided into several areas (units) each having an appropriate size. Subsequently, each unit is inputted into the OPC tool. In the OPC tool, each inputted unit is processed. Subsequently, all units are subjected to an OPC process. In this case, every time each unit is processed, the correction library is read and the edge coordinate group is searched. Moreover, at each end of the process, it is necessary to output the correction library.

When the number of inputs/outputs is small, the time required for the input/output is substantially negligible. When the number of units increases, the number of inputs/outputs of the correction library with respect to the OPC tool sometimes reaches 100 or more. Then, the input/output time of the library becomes large to such an extent that the time is not negligible.

The present method comprises: removing the edge coordinate group which does not contribute to the correction stored in the library beforehand to generate an efficient correction library (second correction library). Moreover, when the efficient correction library is used, the input/output time of the correction library can be reduced. As a result, the correction time can be shortened as compared with the conventional method.

It is to be noted that "the increase of the unit number" can also be rephrased as "enlargement of scale of the design data".

Moreover, in the method described in the present embodiment, a degree of generation of the first correction library effective for the design data before the process is very important. A method of this generation can be considered mainly for a derivative type and mother type. With a plurality of devices (derivative types) having comparable design rules, the generated library is effective for each device. Therefore, when the reuse of the library is repeated, it is possible to allow the library to grow.

Furthermore, with newly developed devices such as a mother product, different from a derivative product, the effective library does not exist. In this case, it is necessary to generate the library in a separate method beforehand. As described in the first embodiment, a generation method comprises: generating the library from modules such as a standard cell and macro cell beforehand for a logic device, so that the library can be used to correct the device with the standard or macro cell used therein at a high speed. Another method of generating the library beforehand from the layout being designed is proposed in Jpn. Pat. Appln. No. 2001-375025. Examples of the method also include a method of generating the library simultaneously with layout verification by a lithography simulator.

Additionally, it is requested to generate the correction library during the generation of the design data. In general, the verification is performed by a design rule check (DRC) for final verification of the design data. During the execution of the DRC, substantially completed design data is prepared. Therefore, when the generation of the correction library is started simultaneously with the DRC execution, it is possible to extract the edge coordinate group from the substantially completed design data.

Moreover, there can also be considered a method for generating the correction library, comprising: obtaining a design layout of an ASIC product for a second sign off time; and generating the library from the layout. When the correction library is generated beforehand at a time of completion of the design layout in this manner, it is possible to prepare the library for use in the OPC process before the process.

(Fifth Embodiment)

When the library based correction is performed, the correction information stored in the library can be handled as a design resource appropriate for the mask correction. Therefore, when as many design resources as possible are collected, more efficient correction is possible. Therefore, when the correction library is shared and used, and the newly generated library is supplied, a high-speed correction is possible, and the design resource can be increased. To share and use the library, reliability of the library needs to be guaranteed. It is essential to automate all the processes such as the filtering of the correction library described in the fourth embodiment, the updating of the correction value group, and the management of the correction library without using any manual operation.

Figure 10:
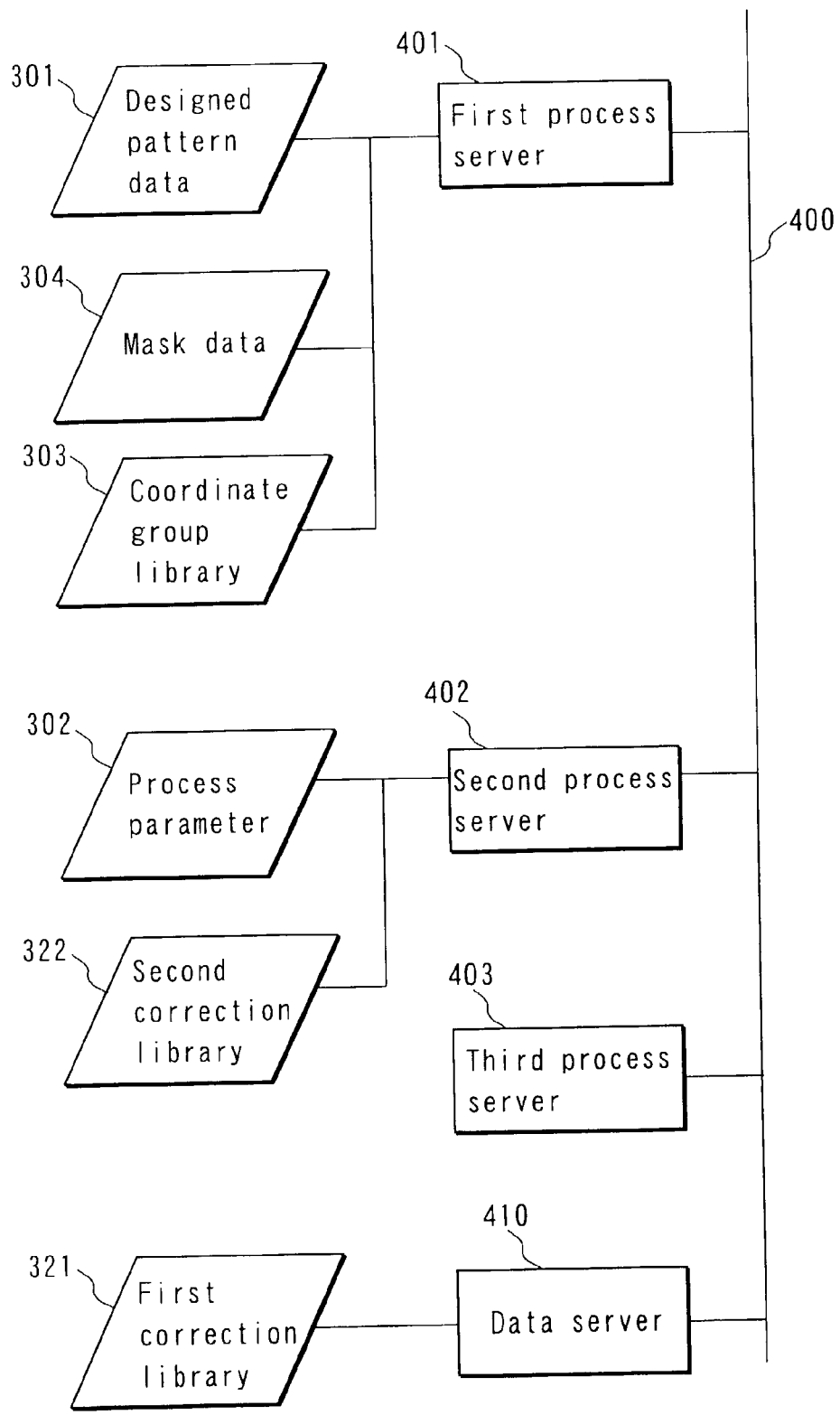
FIG. 10 is a diagram showing a schematic constitution of a mask generation system according to a fifth embodiment.

FIG. 10 is a diagram showing a schematic constitution of a mask generation system according to a fifth embodiment of the present invention. This system is of a server client type constituted via Internet or Intranet.

Examples of a client for the mask correction include a device manufacturing maker, chip design maker, mask manufacturing maker, and process engineer. The client selects design data as an object of the mask correction and a process for processing the design data on a wafer, and accesses a process server.

The chip design maker inputs the design data 301 into a first process server 401. Moreover, the device manufacturing maker inputs the correction parameters 302 into a second process server 402.

The first process server 401 executes a process of extracting the edge coordinate group from the design data 301. Moreover, the coordinate group library 303 including only the extracted edge coordinate group is generated.

The coordinate group library 303 is sent to the second process server 402 via a network 400. In the second process server 402, a mask data processing (MDP) tool for obtaining the correction value group from the edge coordinate group is mounted. The MDP tool performs the simulation and obtains the correction value group from the edge coordinate group and process conditions. In the second process server 402, a parallel process for raising the speed of the correction is possible. Furthermore, it is possible to set a dispersed process for raising the speed of the process from the MDP tool.

The second process server 402 checks whether or not the edge coordinate group agreeing with the edge coordinate group registered in the coordinate group library 303 is registered in the first correction library 311. When there is the agreeing edge coordinate group, the edge coordinate group and correction value group stored in the first correction library 311 are registered in the second correction library 312. When there is not the agreeing edge coordinate group, the correction parameter and edge coordinate group are inputted into a correction value group calculation tool, and the correction value group is calculated. The edge coordinate group and the calculated correction value group are registered in the second correction library 312. Additionally, when the second correction library 312 does not exist, the second correction library 312 is newly generated. Subsequently, the edge coordinate group and correction value group are registered in the generated second correction library 312.

With respect to all the edge coordinate groups registered in the coordinate group library 303, the edge coordinate group and correction value group are registered in the second correction library 312, and the second correction library 312 is transmitted to the first process server 401 and data server 410 via the network 400. The first process server 401 generates the mask data 304 based on the coordinate group library 303, second correction library 312, and design data 301. The generated mask data 304 is transmitted to a third process server 403 via the network 400. The mask manufacturing maker manufactures the mask based on the mask data 304 stored in the third process server 403.

The data server 410 merges the first correction library 311 with the second correction library 312. Moreover, the redundant correction information is deleted from the merged correction library. It is to be noted that a pair of the edge coordinate group and the newly generated correction value group may also be added/registered into the first correction library upon the generation.

The updated first correction library is stored in the data server 410 in generation to generate the next mask data. The next design data is generated in a similar flow as described above.

When the mask correction method and system of the server client type described herein are used, the client can perform the mask correction at a high speed, and the design resource (edge coordinate group) stored in the library can easily be collected.

It is to be noted that the chip design maker, device manufacturing maker, and mask manufacturing maker are not separate makers in some case. Therefore, the first and second process servers, the second and third process servers, or the first and third process servers may also be the same process server.

Moreover, program activated in the server is programmed with Internet oriented languages such as JAVA, so that all the processes can be automated without using any manual operation. As a result, a trouble is reduced, and it is also possible to largely enhance the reliability of the library.

It is to be noted that the present invention is not limited to the above-described respective embodiments, and can variously be modified without departing from the scope in an implementation stage. Furthermore, the above-described embodiments include various stages of the invention, and various inventions can be extracted by an appropriate combination of a plurality of disclosed constituting elements. For example, even when some constituting elements are removed from all the constituting elements described in the embodiments, but when at least one of the problems described in the paragraphs of the problems to be solved by the present invention can be solved, and when at least one of the effects described in the paragraphs of the effects of the present invention, the constitution with the constituting elements removed therefrom can be extracted as the invention.

In addition, it is possible to variously modify and carry out the present invention without departing from the scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern generation method of generating mask patterns from designed patterns, comprising:
    preparing a correction library in which a plurality of an edge coordinate group and a correction value group to correct the edge coordinate group are registered;
    acquiring a first edge coordinate group from a first designed pattern;
    checking whether or not an edge coordinate group agreeing with the first edge coordinate group is registered in said correction library;
    calculating the correction value group to correct the first edge coordinate group by simulation based on a first correction parameter, when the edge coordinate group is not registered;
    registered a pair of the calculated correction value group and the first edge coordinate group into said correction library;
    reading the corresponding correction value group from said correction library, when the edge coordinate group is registered;
    correcting the first designed pattern in accordance with the calculated correction value group or the read correction value group, to generate the first mask pattern;
    acquiring a second edge coordinate group of a second designed pattern different from the first designed pattern;
    checking whether or not the edge coordinate group agreeing with the second edge coordinate group is registered in said correction library;
    calculating the correction value group with respect to the second edge coordinate group by the simulation based on a second correction parameter, when the edge coordinate group is not registered;
    registering a pair of the calculated correction value group and second edge coordinate group into said correction library;
    reading the corresponding correction value group from the correction library, when the edge coordinate group is registered; and
    correcting the second designed pattern in accordance with the calculated correction value group or the read correction value group, to generate a second mask pattern.

2. The mask pattern generation method according to claim 1, wherein said second designed pattern is constituted by changing a part of the first designed pattern.

3. The mask pattern generation method according to claim 1, wherein said correction value group is calculated by performing at least an optical simulation and a process simulation.

4. The mask pattern generation method according to claim 1, wherein the preparing of said correction library includes:
    generating beforehand said correction library in which the first edge coordinate group and correction value group included in the first designed pattern are registered, before the designed of the designed patterns has ended.

5. The mask pattern generation method according to claim 4, wherein the preparing of said correction library includes:
    setting the reference point with respect to the first designed pattern being designed, and obtaining the edge coordinate group of the pattern included in the area centering on the set reference point;
    calculating the correction value group concerning the edge coordinate group by the simulation based on the first correction parameter; and
    registering said edge coordinate group and corresponding correction value group in said correction library.

6. The mask pattern generation method according to claim 4, wherein the design pattern comprises standard cells or macro patterns; and wherein the preparing of said correction library includes:
    acquiring the edge coordinate group of each standard cell or macro pattern for use in said designed pattern;
    calculating the correction value group of the edge coordinate group by the simulation using the first correction parameter; and
    registering said edge coordinate group and correction value group in said correction library.

7. The mask pattern generation method according to claim 1, further comprising:
    recalculating the correction value group for each edge coordinate group included in said correction library using the second correction parameter, when the first correction parameter concerning the second designed pattern;
    registering a pair of said second edge coordinate group and the calculated correction value group into a second correction library;
    correcting the second designed pattern using the second correction library.

8. The mask pattern generation method according to claim 7, wherein the recalculating of said correction value group includes: calculating the correction value group for each edge coordinate group by a parallel process to simultaneously calculate the correction value groups with respect to a plurality of edge coordinate groups.

9. The mask patter generation method according to claim 1, wherein the acquiring the first edge coordinate group includes:
   setting a reference point in the first designed pattern;
   acquiring a first edge coordinate group of the pattern in an area centering on the set reference point.

10. A manufacturing method of a mask comprising:
   preparing the second mask pattern generated using the mask pattern generation method according to claim 1; and
   forming a mask using the second mask pattern.

11. A manufacturing method of a semiconductor apparatus comprising:
   preparing the mask formed by the manufacturing method of the mask according to claim 10; and
   exposing a processed film using the mask, the processed film formed on a semiconductor substrate of the semiconductor apparatus being manufactured.

12. A mask pattern generation method of generating a mask pattern from a designed pattern, comprising:
   preparing the designed pattern;
   preparing a correction parameter;
   preparing a first correction library in which a plurality of pairs of an edge coordinate group and a correction value group to correct the edge coordinate group is registered;
   acquiring an edge coordinate group of said designed patterns;
   generating a second correction library in which only the plurality of pairs of the edge coordinate group in accordance with said acquired edge coordinate group and the correction value group are registered in the first correction library and/or calculated by simulation using said correction parameter and said acquired edge coordinate group; and
   correcting the designed pattern using said second correction library.

13. The mask pattern generation method according to claim 12, wherein the first correction library includes a plurality of correction library groups classified for each mask process, lithography process, etching process, and optical proximity correction.

14. The mask pattern generation method according to claim 12, wherein the first correction library comprises a plurality of correction library files which is classified in accordance with a design rule, and
   referring to the correction library file corresponding to the design rule of said design data to generate said second correction library.

15. The mask pattern generation method according to claim 12, wherein the first correction library comprises a plurality of correction library files which is classified in accordance with a layer, and
   referring to the correction library file corresponding to the layer of said design data to generate said second correction library.

16. The mask pattern generation method according to claim 12, further comprising:
   generating a third correction library constituted by merging the first correction library with the second correction library; and
   leaving one pair of the edge coordinate group and correction value group and deleting the other sets of the edge coordinate group and correction value group from an overlapped edge coordinate group which is included in the third correction library.

17. The mask pattern generation method according to claim 12, wherein said correction parameter is at least one condition of mask, lithography, development, and etching conditions.

18. The mask pattern generation method according to claim 12, wherein the acquiring the edge coordinate group includes:
   setting a reference point in the designed pattern;
   acquiring a first edge coordinate group of the pattern in an area centering on the set reference point.

19. A manufacturing method of a semiconductor apparatus comprising:
   preparing a mask using a mask pattern generated by the mask pattern generation method according to claim 12; and
   exposing a film using the mask, the film formed on a semiconductor substrate.

* * * * *

UNITED STATES PATENT AND TRADEMARK OFFICE
CERTIFICATE OF CORRECTION

PATENT NO. : 6,964,031 B2
DATED : November 8, 2005
INVENTOR(S) : Kotani et al.

It is certified that error appears in the above-identified patent and that said Letters Patent is hereby corrected as shown below:

Column 15,
Line 56, change "registered a" to -- registering a --.

Column 16,
Line 29, change "designed of" to -- designing of --.
Line 57, change "the second" to -- the first designed pattern is different from the second correction parameter concerning the second --.

Column 17,
Line 3, change "patter" to -- pattern --.
Line 7, change "pattern in" to -- pattern included in --.

Column 18,
Line 33, change "pattern in" to -- pattern included in --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,964,031 B2
DATED : November 8, 2005
INVENTOR(S) : Kotani et al.

It is certified that error appears in the above-identified patent and that said Letters Patent is hereby corrected as shown below:

<u>Title page,</u>
Item [75], Inventors, change "Ichiakwa" to -- Ichikawa --.

Signed and Sealed this

Twenty-fifth Day of April, 2006

JON W. DUDAS
*Director of the United States Patent and Trademark Office*